United States Patent [19]

Shapiro et al.

[11] Patent Number: 4,593,381

[45] Date of Patent: Jun. 3, 1986

[54] MICROPLEX CHIP FOR USE WITH A MICROSTRIP DETECTOR

[75] Inventors: Stephen Shapiro, Palo Alto, Calif.; Bernard H. Hyams, Geneva, Switzerland; Sherwood Parker, Berkeley; James Walker, Palo Alto, both of Calif.

[73] Assignee: The Board of Trustees of the Leland Stanford Junior University, Stanford, Calif.

[21] Appl. No.: 552,088

[22] Filed: Nov. 15, 1983

[51] Int. Cl.⁴ .............................................. G11C 13/00
[52] U.S. Cl. ...................................................... 365/45

[58] Field of Search ................. 365/45, 189, 230, 233, 365/226; 307/530

[56] References Cited

U.S. PATENT DOCUMENTS 4,285,051  8/1981  Henneuse ............................. 365/45
4,300,210 11/1981  Chakravarti et al. ................. 365/45

Primary Examiner—Terrell W. Fears
Attorney, Agent, or Firm—Flehr, Hohbach, Test, Albritton & Herbert

[57] ABSTRACT

A multiple channel single chip amplifier and read out system using dual sample and hold circuits for noise cancellation.

19 Claims, 3 Drawing Figures

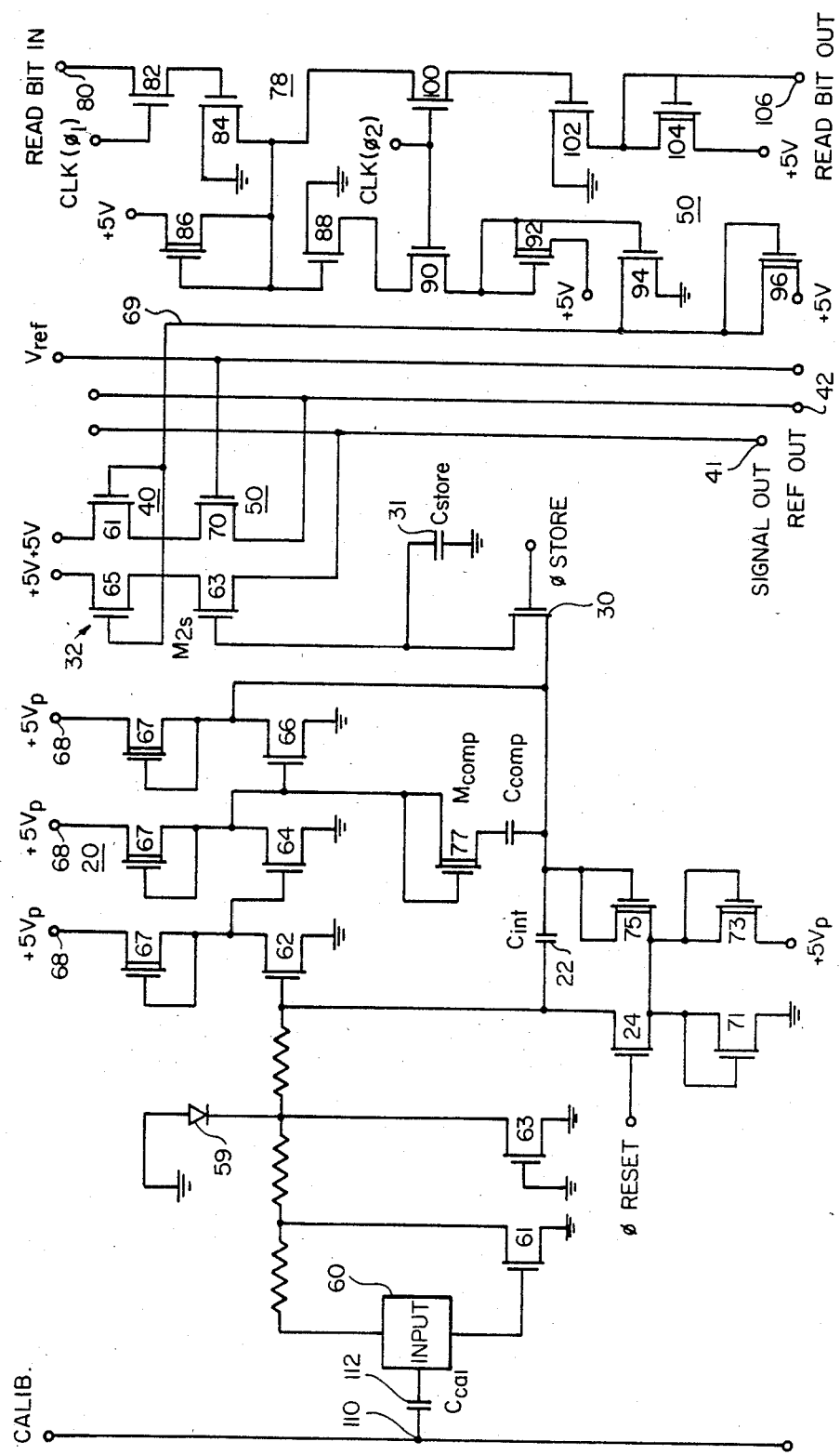
FIG_1

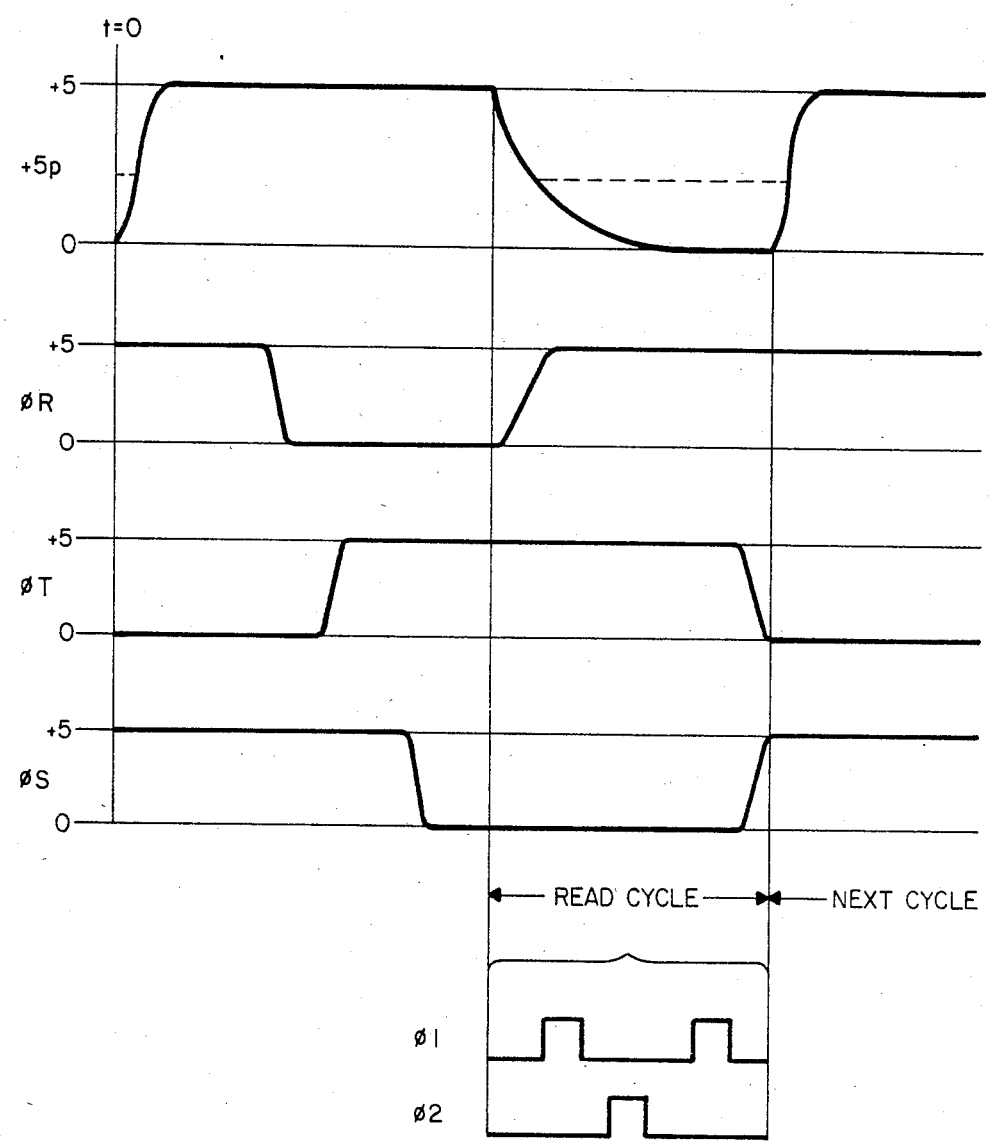
FIG_2

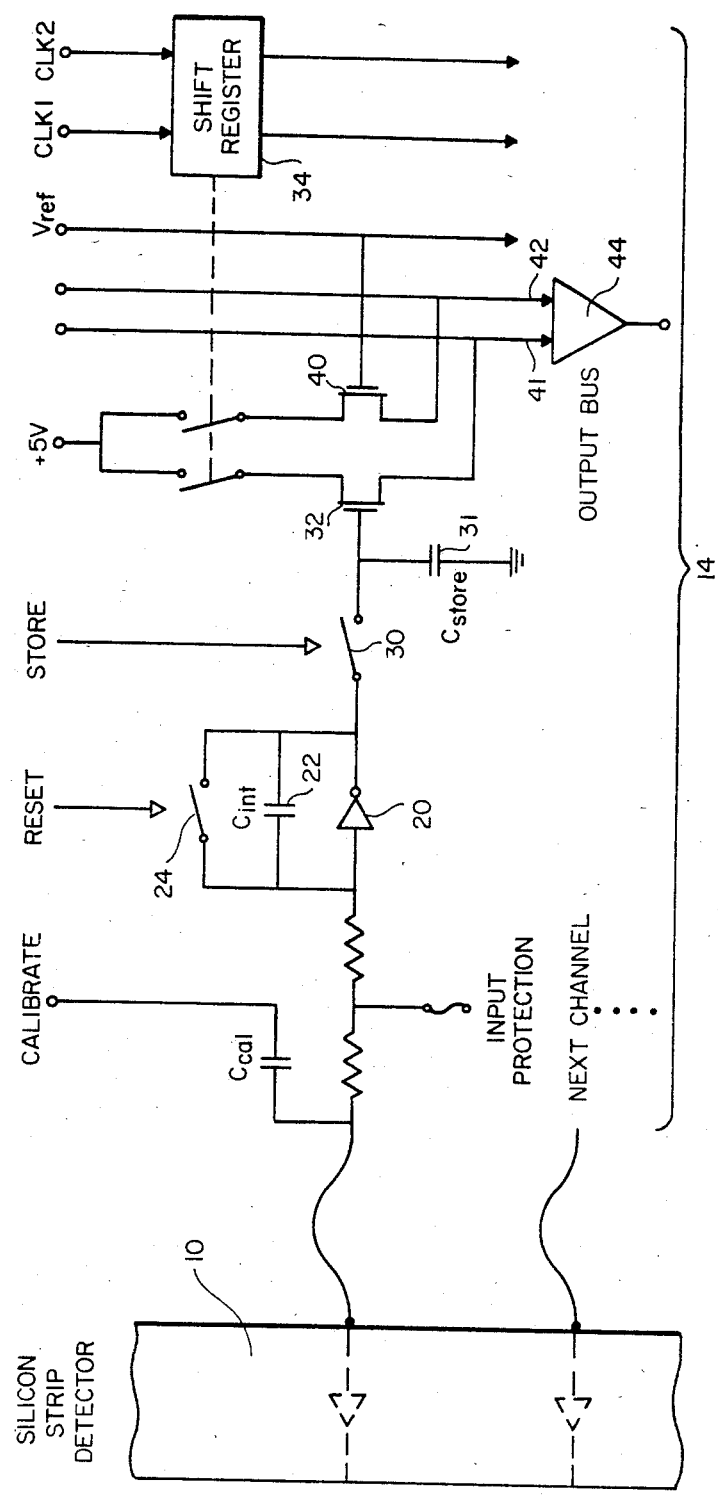
FIG_3

MICROPLEX CHIP FOR USE WITH A MICROSTRIP DETECTOR

The U.S. Government has rights in this invention described and claimed herein pursuant to DOE Contract No. DE-AC003-76SF00515.

This invention is directed generally to a device for read-out and storage of very low level voltage signals and specifically for read-out and accumulation of signals from each of the strips of a microstrip detector and transfer to a storage device, utilizing a chip of extremely small size.

The present invention is especially useful in combination with microstrip detectors of the type which are used in high energy physics laboratories, medical tomography utilizing particle beams, or the like. Such microstrip detectors are described at length in an article by Heijne et al entitled *A SILICON SURFACE BARRIER MICROSTRIP DETECTOR DESIGNED FOR HIGH ENERGY PHYSICS* published in *Nuclear Instruments and Methods* 178 (1980) 331–343 and *A SILICON TELESCOPE TO STUDY SHORT-LIVED PARTICLES IN HIGH ENERGY HADRONIC INTERACTIONS*, G. Hyams, et al, Nuclear Instrumentation Methods 205 (1983) 99 incorporated herein by reference. As explained in this article, the detector comprises a layer of silicon having a number of strips, typically on the order of 100 or more, at about a 20 μm pitch. As a particle to be detected passes through the strip, 5000–50,000 electrons are released, depending on the thickness of the detector. In turn, these electrons are collected by the strips on the surface of the microstrip detector. The microstrip detector thus functions as a number of parallel connected diodes, whose outputs are to be individually read out and stored by an associated amplifier and storage capacitor.

However, in prior amplifier designs used in such systems, considerable space was required, resulting in an amplifier array which was significantly larger than the size of the microstrip detector itself. As a result, the amplifier could not be placed close to the detector being monitored, making it difficult to achieve accurate voltage read-out because of the low levels of charge being detected. For best results each detector strip requires its own amplifier and signal storage system; thus, it becomes difficult to build a large, densely packed array of these detectors.

It is an objective of the present invention to provide a microstrip detector read-out amplifier and storage capacitor for each strip of the detector which is of small size and operates at very high speed.

The small size is very important because for accurate particle detection, it is necessary that the detection be as close to the collision point as possible, to exploit the physics potentialities of the machines. The chip disclosed herein makes it possible to place the detector sufficiently close to the point of collision to achieve this end.

It is a further object of the present invention to provide such a detector to reliably detect and store very small charge levels as voltages ($V=Q/C$).

A further problem typical of such detectors is that because significant amplification of the signals from each microstrip must be achieved, very high currents are needed to power the amplifiers.

Therefore, it is another objective of the present invention to provide a means for reducing the power drain on the system, especially in the amplifier section which must operate at very high frequency.

These and other objectives are achieved in the present invention wherein each channel of the microplex read-out detector comprises a high frequency amplifier; a sample and hold device for storing the voltage representing the accumulated charge on the strip; and a means for reading out the accumulated charge from the sample and hold device associated with each strip onto an output bus.

The microplex detector chip includes an interface device for initiating read-out of each sample and hold circuit, while simultaneously initiating a second circuit which provides a way of reading out the switching transients. The DC levels are made similar by the adjustment of V ref, then by subtracting this reference signal from the actual voltage level output from each sample and hold circuit, a true representation of the voltage detected by each strip is provided.

Read-out of all the sample and hold circuits on a detector chip is achieved utilizing a single shift register having a number of gate output lines equal to the number of sample and hold circuits. The shift register responds to a single shift pulse by sending gate pulses to the sample and hold circuits in succession.

Means are also provided for energizing the high frequency amplifier transistors of the input channel only during read-in of data from the microstrip detector into the sample and hold circuit, while removing the power and thus eliminating the current drain during the read-out portion of each cycle.

The invention can be fully understood by reference to the succeeding figures wherein FIG. 1 comprises a detailed schematic of the portions of a detector chip necessary to read the charge detected by one strip of a microstrip detector and forward a voltage representing that charge over a bus to an amplifier; ADC and memory.

FIG. 2 comprises a timing diagram useful in understanding the operation of the circuit of FIG. 1;

FIG. 3 comprises a block diagram of the basic elements of the microstrip detector and amplifier of the present invention.

FIG. 3 illustrates in block diagram form the advantageous relationship between the microstrip detector 10, and the read-out amplifier of the present invention 14. FIG. 3 comprises a simplified block diagram of the present invention including an input amplifier 20 having a integration capacitor 22 and reset switch 24. Charge Q detected by a strip on the microstrip detector 10 is accumulated on the capacitor C-22 while the switch 30 is closed so the amplifier output also drives C-31 to the same voltage ($V=Q/C$). This output is gated on by the shift register. MOS voltage follower transistor 32 is connected to a shift register 34 having a single shift pulse input 36 and a number of outputs equal to the number of detectors on the microstrip detector 10. The read bit is passed along a chain of registers driven by a 2-phase clock. The functions controlled by this clock are shown in greater detail in FIG. 1. When the appropriate gate to the MOS transistor 32 (which is essentially an output bus driver) is energized, the voltage (representing the accumulated charge during a given event on one strip of the microstrip detector) accumulated on capacitor 31 is transferred to an output bus 41. The shift register 34 simultaneously gates a reference bus driver 40 which ideally is of identical design to the output driver 32 associated with each sample and hold circuit. This extra MOS FET 40 receives an input voltage from a reference source R such that its output onto a bus 42 represents the pedestal and effects of switching transients inherent in each amplifier circuit. Thus, by applying the data on bus 41 and the reference level on bus 42 as the two inputs on a difference amplifier 44, an appropriate signal is developed which accurately represents the low level voltage which in turn represents the accumulated charge on a single microstrip of the detector 10. This charge can then be transferred to an A to D converter, then to a memory and stored.

FIG. 1 comprises a relatively detailed schematic diagram of the amplifier 20 and integrating capacitor 22 and switch 24; the transfer switch 30; the storage capacitor 31; the output bus driver 32; the reference driver 40 which is of substantially similar design to driver 32; a unit cell of the shift register 36 which is used to gate each output bus driver; and an interface circuit 50 which comprises the appropriate logic to respond to the shift pulse to shift the data onto output bus 41 and the reference signal onto bus 42.

The detector strip itself is represented by a reverse biased diode 10 whose output is connected to the input 60 of one channel of the read-out chip. Two inputs are provided to each channel; one from the strip detector, and one capacitatively coupled from a calibration line. Input protection is provided by a diode 59, which shorts negative signals to the substrate, and two normally-off transistors, 61,63 which short large positive signals. The first is a metal-gate field oxide transistor which becomes conducting at about +20 V, shorting the input path to ground. The path switches from metal to N+ diffusion at this gate contact. Negative signals that carry the quiescent +2 V of this line to below −0.7 V which directly shorts to the P type substrate. The second transistor is also turned on by a large positive voltage. THe signal path flows along the drain of a normally turned off transistor. A large positive signal produces field lines in the channel which are particularly intense along the gate-drain border, initiating an avalanche that shorts the signal to ground. The signal path must have a significant series resistance for this scheme to protect the input. On this chip, each channel has an amplifier 20 comprising a series of high frequency transistors 62, 64, 66 connected through depletion transistor loads 67 to a pulsed bias source 68. As already explained above, these high frequency transistors represent a significant current drain during operation of the system. Therefore, a simple switch means is provided to disconnect the power supply 68 from all transistors of the amplifier. As a result, except before and during actual amplification of input signal during the time period shown on the top line of FIG. 2, these transistors draw little or no current. Specifically, as will be apparent from the timing diagram of FIG. 2, the transistors are only connected to the plus 5 volts during the critical portion of the event cycle when the data must be amplified and transferred to the storage capacitor 31 of the sample and hold circuit, but not during the read cycle.

The charge received on input line 60 is stored on capacitor 22 while switch 24 is open and switch 30 is closed. Under these conditions the charge on capacitor 22 is amplified and transferred to the storage capacitor 31. This capacitor 31 is effectively the storage capacitor of the sample and hold circuit. As will also be seen from FIG. 2, with the switch 30 being closed by line $\phi$s and after the event which is to be monitored ($\phi$T) has begun, and with switch 24 open ($\phi$R), all the charge received on input line 60 is amplified directly by the high frequency transistors of amplifier 20 and is stored on capacitor 22. Capacitor 31's voltage then follows that of the integrating capacitor 22. Oscillation will be prevented using a compensation network comprising depletion transistors 77 and capacitor C comp between the output of the second stage of the amplifier and the feedback line.

A special problem arises when the reset transistor 24 is turned on to discharge the integration capacitor 22. This completes a DC path back to the input. Since the detector has an extremely large resistance, nearly the full output voltage would appear at the input causing the circuit to oscillate. The resistance of the depletion mode reset transistor 75 together with the parallel combination 71,73 provides the necessary division to prevent this. The transistor set is also designed to provide a DC Voltage level (+2 V) equal to the normal quiescent interstage voltage.

It is apparent that the transfer of the data stored on a sample and hold capacitor 31 now depends only on turning on transistor 63 of the output bus driver 32. This in turn is accomplished by turning on the gating transistor 65 so that the +5 volt bias switch is applied to transistor 63. The turn on of the output bus driver is controlled by the interface circuit 50 putting a high voltage level signal on line 69 which is also connected to the gate transistor 61 of reference amplifier 40. By turning on this reference bus driver 40 simultaneously with the output data bus driver 32, while the reference voltage is applied to the gate of transistor 70 of the bus driver 40, a reference signal appears on bus 42 simultaneously with the detector strip output data appearing on bus 41. These two signals are transferred over the pair of output busses 41, 42 (which are common to all the channels) to a difference amplifier 44 provided external to the chip which derives the difference of the two signals. This is the actual data signal representing the charge detected by each strip detector which is then stored for each channel amplifier.

As has been discussed above, each of the channel amplifiers is separately gated using a shift register 36 (FIG. 1) comprised of a number of unit cells at least equal to the number of channel amplifiers to be read out. A typical unit cell 78 is shown comprising an input 80 for receiving the serially transferred shift pulse and an output 106 whereby the shift pulse is transferred to the next unit cell in the shift register. A pair of reading clock pulses labeled $\phi 1$ and $\phi 2$ (which follow each other sequentially in time) are simultaneously applied to each one of the shift register unit cells. This is a known construction for a two phase shift register wherein the two clock pulses are simultaneously received by every unit cell; when the two pulses coincide with the arrival of the serialized shift pulse, then a gate pulse to the output bus driver 32 and reference amplifier 40 is developed on line 69. A brief example will serve to explain how this occurs.

The arrival of the shift pulse causes input 80 to shift from a high to a low (or a 1 to a 0) state. When this low state exists concurrent with the clock signal $\phi 1$, which is applied to the gate of transistor 82, then a 0 appears at the gate input to transistor 84 which together with transistor 86 comprises an inverter. This in turn causes a 1 to appear at the gate of transistor 88 and therefore a "0" to the source of transistor 90. Any further changes in state of the transistors in the interface circuit 50 must await the arrival of the second phase of the timing signal $\phi 2$, which is applied to the gate of transistor 90. Even though the signal $\phi2$ arrives after the signal $\phi1$, because of the switching arrangement, the signal 1 remains on the gate of transistor 88. When the $\phi2$ input to gate 90 goes high, this turns on the transistor, grounding the other side of transistor 90 and therefore a 0 appears at the gate of transistor 94. This in turn causes, due the action of transistor 94 together with transistor 96, a 1 to appear on line 69. In turn this signal is applied via the output line 66 from this interface/trigger circuit 50 to the gates of transistor 65 (which turns on the output bus driver) and the gate of transistor 61 (which turns on reference 40) applying the appropriate selected voltage and reference outputs to the buses 41 and 42.

Concurrently, the appearance of the time signal $\phi2$ turns on transistor 100; prior to the arrival of timing signals $\phi2$, a 1 was on the input to this transistor. As the gate is turned on, the 1 is applied to the gate input of transistor 102 which together with transistor 104 again comprise an inverter. The output 106 of this shift register cell 78 goes from a 1 to a 0 state. In this manner, the low signal is now propogated into the next shift register cell to cause the next successive cell to be read. Of course, this next successive cell can only be read with the next appearance of the read signals $\phi1$ and $\phi2$ shown in the bottom lines of the timing diagram of FIG. 2. A 3 stage pad driver is provided after the last shift register cell to drive the readout bit to a possible second chip.

It can be seen that the amplifiers disclosed above occupy a limited amount of space; and being of regular MOS construction lend themselves to a layout which occupies an extremely small area. By using a shift register which progates a single shift pulse from channel to channel, highly accurate,, high speed data readings may be taken, limited only by the speed of propagation of the pulse.

By proper layout techniques, the same oxide layer is used for the calibrating capacitor and integrating capacitor of the channel amplifier, resulting in a highly accurate calibration cycle as the calibration system has first order independence from variations in oxide thickness. The amplifier storage system uses calibrate lines 110 (there are 4 of them one to each fourth channel) and calibrate capacitors 112 (one per channel) to calibrate the system and allow accounting for feed through from adjacent storage cells. The calibrate circuit line 110 is an alternate signal source. The readout cycle for calibrate is the same as for data taking but is sued only when not taking data in order to calibrate the system.

Modifications of the specific embodiment disclosed above may become apparent to an engineer of skill in the art who has studied the above specification. Therefore, the scope of the present invention is to be limited only by the claims which follow.

What is claimed:

1. A single chip integrated system for amplifying and reading out data signals from each strip of a multiple strip microstrip detector wherein a plurality of very low level signal inputs must be substantially simultaneously sampled and amplified, the amplified data samples being sequentially read out on a single line, comprising
   a plurality of charge integrator means, one connected to each of said strips for collection of the output charge of each microstrip detector strip with high charge transfer efficiency,
   a sample and hold circuit for storing a measure of the total charge value collected in each said strip,
   an amplifier for non-destructive readout of the total charge value of each said sample and hold, and
   means for serially controlling each of said amplifiers for sequential connection of each sample and hold circuit's signal to the output line to initiate read-out of the stored data.

2. A system as claimed in claim 1 further comprising
   a reference level amplifier of substantially identical design to said read-out amplifier concurrently triggered by said controlling means with said read-out amplifier, and
   an off chip difference amplifier connected to the outputs of said read-out amplifier and said reference amplifier to define the actual level of charge from each strip.

3. A system as claimed in claim 2 further comprising a memory means connected to said difference amplifier for storing the output of each of said sample and hold circuits.

4. A system as claimed in claim 3 comprising timing means for defining a first cycle wherein said sample and hold circuit is discharged to ground and a second cycle wherein said sample and hold circuit accumulates the output of one of said strips.

5. A system as claimed in claim 3 wherein said amplifier means includes an integration capacitor in parallel with said operational amplifier and a reset switch in parallel with said capacitor for defining said discharge and storage cycles.

6. A system as claimed in claim 5 further comprising switch means between said input amplifier and said sample and hold circuit for timing the accumulation of charge by said hold circuit.

7. A system as claimed in claim 2 including control means responsive to timing signals for reading out the accumulated data from said sample and hold circuits after accumulation of charge transferred from said detector strip onto said sample and hold circuit.

8. A system as claimed in claim 7 wherein said input amplifier comprises a series of connected high-frequency transistors to provide a high gain amplifier cooperating with a feedback capacitor to accurately accumulate charge on each said strip.

9. A system as claimed in claim 7 wherein said read-out control means comprises a shift register having one input, 2 clocks, and n control outputs, one of said n control outputs running to each of said readout amplifiers and to said reference amplifier.

10. A system as claimed in claim 9 wherein said shift register comprises an interface between each of said read-out amplifiers and said shift register, each said interface being responsive to timing signals to potentially establish a read-out condition for the associated amplifier and responsive to a serial shift pulse to activate a read-out condition for only one of said read-out amplifiers at a time.

11. A system as in claim 1 wherein said integrator means comprises a high gain amplifier circuit and a feedback capacitor to precisely accumulate charge from said connected strip during a given period of time.

12. A system for detecting and transferring to storage a number of output signals from the strips of a microstrip detector, the transfer to said storage means being over a single data bus, the system comprising
    amplifier means associated with each detector strip for amplifying the output of each of said detectors, sample and hold means connected to each amplifier for storing the output of each one of said strips in a storage cycle, switch means between said amplifier means and said storing means, said switch means being closed during said discharge cycle and said storage cycle and open during said read cycle, a multiplex output system including a gating system for causing read-out of each of said storage means during a reading cycle onto a first output bus and simultaneously reading a signal representing system transients onto a second output bus, and means for comparing said signals on said first and second buses to develop an accurate representation of the signal from each strip of said microstrip detector.

13. A system as claimed in claim 12 including a power supply for said amplifier, a first capacitor in parallel with said amplifier, and means for shorting out said capacitor to discharge said storage means in a discharge cycle.

14. A system as claimed in claim 13 further comprising means for energizing said amplifier with said power supply during said storing cycle.

15. A system as claimed in claim 11 wherein said trigger system comprises a two-phase shift register for selectively enabling each of said storage means responsive to timing signals supplied in parallel to each of said storage means and a serialized trigger pulse for selecting each of said storage means one at a time for read-out.

16. A system as claimed in claim 15 wherein said connections to said first and second buses each comprise a pair of transistors, one transistor of each pair receiving said gate signal to initiate said output, the second transistor of one pair receiving said stored signal, the second transistor of the other pair receiving said system transient reference signal.

17. A method for substantially simultaneously detecting a number of low level voltage output signals from the individual strips of a microstrip detector, and transferring amplified representations thereof to storage over a single output bus, comprising the steps of integrating the charge found on each strip, amplifying the output of each of said strip, storing the output of said amplifying means as a voltage on a capacitor in a first sample and hold circuit, selectively, serially reading out the values held on each of said storage means onto a first bus, storing a representation of the system noise present at time of charge measurement in a second sample and hold circuit located adjacent the first sample and hold circuit, simultaneously reading out the reference level voltage representing noise from the separate second sample and hold circuits onto a second bus, comparing said two output voltages to establish a true representation of said microstrip detector output signal.

18. The method of claim 17 wherein said amplifying means are selectively de-energized during said read-out steps of said method.

19. The method of claim 18 further comprising the steps of initializing all of said storage means, and then selectively and sequentially reading out the storage associated with each of said detector strips.

* * * * *